United States Patent
Poletto et al.

(10) Patent No.: US 10,917,087 B2
(45) Date of Patent: Feb. 9, 2021

(54) CONTROL CIRCUIT FOR POWER SWITCH

(71) Applicants: STMICROELECTRONICS S.r.l., Agrate Brianza (IT); STMICROELECTRONICS, INC, Coppell, TX (US); STMICROELECTRONICS (ALPS) SAS, Grenoble (FR)

(72) Inventors: Vanni Poletto, Milan (IT); David F. Swanson, Belleville, MI (US); Giovanni Luca Torrisi, Aci Catania (IT); Laurent Chevalier, Roissard (FR)

(73) Assignees: STMICROELECTRONICS S.r.l., Agrate Brianza (IT); STMICROELECTRONICS, Inc., Coppell, TX (US); STMICROELECTRONICS (ALPS) SAS, Grenoble (FR)

( * ) Notice: Subject to any disclaimer, the term of this patent is extended or adjusted under 35 U.S.C. 154(b) by 0 days.

(21) Appl. No.: 16/719,053

(22) Filed: Dec. 18, 2019

(65) Prior Publication Data
US 2020/0127660 A1    Apr. 23, 2020

Related U.S. Application Data

(63) Continuation of application No. 16/274,844, filed on Feb. 13, 2019, now Pat. No. 10,560,092.

(30) Foreign Application Priority Data

Feb. 27, 2018 (FR) ...................... 18 51699

(51) Int. Cl.
H03K 17/687 (2006.01)
G01R 19/165 (2006.01)
(Continued)

(52) U.S. Cl.
CPC ... H03K 17/6871 (2013.01); G01R 19/16528 (2013.01); G05B 11/42 (2013.01);
(Continued)

(58) Field of Classification Search
CPC H03K 17/6871; G01R 19/1658; G05B 11/42; G05F 1/561; G05F 1/618; H02J 7/34
(Continued)

(56) References Cited

U.S. PATENT DOCUMENTS 6,256,215 B1   7/2001   Barrett et al.
2012/0086479 A1   4/2012   Carpenter et al.
(Continued)

*Primary Examiner* — John W Poos
(74) *Attorney, Agent, or Firm* — Slater Matsil, LLP

(57) ABSTRACT

A circuit for controlling a first plurality of transistors connected in parallel and a second plurality of transistors connected in parallel, includes: a first plurality of stages, a respective one of the first plurality of stages being configured to supply a first control signal to a respective one of the first plurality of transistors; and a second plurality of stages, a respective one of the second plurality of stages being configured to supply a second control signal to a respective one of the second plurality of transistors. An output current of the respective one of the first plurality of stages is regulated based on a difference between a first value representative of a sum of output currents of each stage of the first plurality of stages and a second value representative of a sum of set points assigned to the first plurality of stages.

20 Claims, 4 Drawing Sheets

(51) Int. Cl.
*G05B 11/42* (2006.01)
*G05F 1/618* (2006.01)
*G05F 1/56* (2006.01)
*H02J 7/34* (2006.01)

(52) U.S. Cl.
CPC .............. *G05F 1/561* (2013.01); *G05F 1/618* (2013.01); *H02J 7/34* (2013.01)

(58) Field of Classification Search
USPC ........................ 327/108, 109, 110, 111, 112
See application file for complete search history.

(56) References Cited

U.S. PATENT DOCUMENTS

| | | |
|---|---|---|
| 2013/0039097 A1 | 2/2013 | Watanabe et al. |
| 2013/0229209 A1* | 9/2013 | Miyauchi ............... H03K 17/14 |
| | | 327/109 |
| 2014/0346864 A1 | 11/2014 | Chemin et al. |
| 2014/0347102 A1 | 11/2014 | Teplechuk |
| 2015/0146468 A1 | 5/2015 | Cho |
| 2015/0381152 A1 | 12/2015 | Choi et al. |
| 2019/0267991 A1 | 8/2019 | Poletto et al. |

* cited by examiner

CONTROL CIRCUIT FOR POWER SWITCH

CROSS-REFERENCE TO RELATED APPLICATIONS

This application is a continuation of U.S. patent application Ser. No. 16/274,844, filed Feb. 13, 2019, which application claims priority to French Patent Application No. 1851699, filed on Feb. 27, 2018, which applications are hereby incorporated herein by reference.

TECHNICAL FIELD

The present disclosure relates generally to control circuits and, in particular embodiments, to a control circuit for a power switch.

BACKGROUND

An H bridge is an electronic structure used to control the biasing across a dipole, forming the load and representing the branch of the bridge. The bridge is formed of four switching elements. More specifically, a first terminal of the load is coupled to a first terminal of application of a potential by a first switch and to a second terminal of application of a potential by a second switch. Similarly, the second terminal of the dipole is coupled to the first terminal by a third switch and to the second terminal by a fourth switch.

This structure can be found in many applications of power electronics, including motor control, converters and choppers, inverters, etc.

SUMMARY

An embodiment provides a circuit for controlling transistors in parallel including at least two stages each intended to supply a control signal to one of the transistors, wherein an output current of each stage is regulated according to the difference between the sum of values representative of the measured output currents of each stage and the sum of values of the set points assigned to all the stages.

According to an embodiment, the outputs of the stages of the circuit are regulated to be substantially identical.

According to an embodiment, each stage includes an adder, an operational amplifier, and a device for measuring a value representative of its output current.

According to an embodiment, one of the stages includes a correction circuit receiving said difference as an input.

According to an embodiment, the correction circuit is a proportional-integral correction circuit.

According to an embodiment, the output of the correction circuit receiving said difference is supplied to the operational amplifier of each stage, each operational amplifier being capable of regulating the output current of the corresponding stage.

According to an embodiment, the control circuit is an integrated circuit.

According to an embodiment, at least part of the transistors in parallel belongs to the integrated circuit.

According to an embodiment, each transistor belongs to an H bridge.

According to an embodiment, transistors of each H bridge are external to the integrated circuit.

According to an embodiment, the set points of the stages are identical.

According to an embodiment, the circuit includes from two to six stages.

Another embodiment provides a chip including at least one control circuit such as previously described.

The foregoing and other features and advantages will be discussed in detail in the following non-limiting description of specific embodiments in connection with the accompanying drawings.

DETAILED DESCRIPTION OF ILLUSTRATIVE EMBODIMENTS

Figure 1:
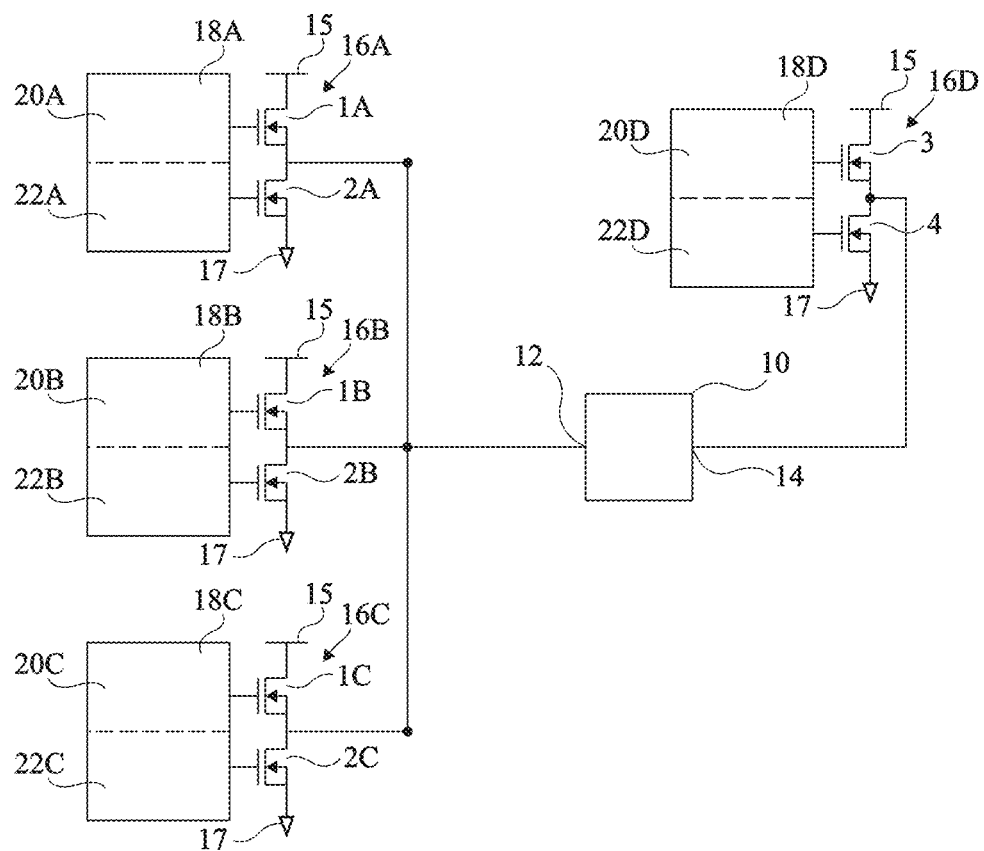
FIG. 1 schematically illustrates a load connected in the branch of three H bridges in parallel.

The same elements have been designated with the same reference numerals in the different drawings. For clarity, only those steps and elements which are useful to the understanding of the described embodiments have been shown and are detailed. In particular, the control circuits include various elements, for example logic circuits, a microprocessor, etc., which will not be detailed.

In the following description, when reference is made to terms qualifying absolute positions, such as terms "front", "back", "top", "bottom", "left", "right", etc., or relative positions, such as terms "above", "under", "upper", "lower", etc., or to terms qualifying directions, such as terms "horizontal", "vertical", etc., it is referred to the orientation of the concerned elements in the drawings.

The terms "approximately", "substantially", and "in the order of" are used herein to designate a tolerance of plus or minus 10%, preferably of plus or minus 5%, of the value in question.

Unless otherwise specified, when reference is made to two elements connected together, this means that the elements are directly connected with no intermediate element other than conductors, and when reference is made to two elements coupled or connected together, this means that the two elements may be directly coupled (connected) or coupled via one or a plurality of other elements.

Embodiments relate generally to the field of control circuits and more particularly to a control circuit for controlling power switches connected in parallel.

FIG. 1 schematically illustrates a dipole forming a load 10. Load 10, for example, a motor, includes a first terminal 12 and a second terminal 14. Load 10 is located in the branch of three H bridges that are connected in parallel.

Each H bridge includes a first switch (e.g. respectively, switch 1A, 1B, or 1C) and a second switch (e.g. respectively, switch 2A, 2B, or 2C) series-connected between a first terminal of application of a power supply voltage (e.g. terminal 15) and a second terminal of application of a second power supply voltage (e.g. terminal 17). The potential of first terminal 15 may be greater than that of second terminal 17. Each pair of first and second switches of an H bridge forms an assembly 16A, 16B, or 16C. The three bridges further include third switch 3 and fourth switch 4, forming an assembly 16D, common to the three bridges. The third and fourth switches are series-connected between terminals 15 and 17. The first and third switches (e.g. switches 1A, 1B, 1C, and 3) are connected to first terminal 15 and the second and fourth switches (e.g. switches 2A, 2B, 2C, and 4) are connected to second terminal 17.

In the present disclosure, it is considered that the voltage between terminals 15 and 17 is a positive voltage referenced to ground potential (e.g. where ground potential is applied to terminal 17). It is however for example possible for the voltage to be a negative voltage referenced to ground potential that is applied to terminal 15.

Terminal 12 of load 10 is coupled to the junction points of the first and second switches of the three H bridges. Terminal 14 of load 10 is coupled to the junction point of the third 3 and fourth 4 switches common to all the H bridges in parallel.

In the example of FIG. 1, each switch of each assembly 16A, 16B, 16C, and 16D is a transistor.

The transistors of each assembly 16A, 16B, 16C, or 16D are respectively controlled by a circuit 18A, 18B, 18C, or 18D. Circuits 18A, 18B, 18C each respectively include an upper stage 20A, 20B, or 20C respectively supplying, as an output, a control signal to transistor 1A, 1B, or 1C, connected to terminal 15. Each of circuits 18A, 18B, 18C also respectively includes a lower stage 22A, 22B, or 22C respectively supplying, as an output, a control signal to transistor 2A, 2B, or 2C, connected to terminal 17. Similarly, circuit 18D includes a stage 20D supplying, as an output, a control signal to transistor 3, connected to terminal 15, and a stage 22D supplying, as an output, a control signal to transistor 4, connected to terminal 17.

The transistors can be controlled by various known methods, for example using pulse width modulation.

Such a structure enables to increase the current supplied to load 10 while minimizing the heat dissipation and the equivalent on-state resistance in the switch.

It is however preferable for the control signals of the transistors having similar functions in the three bridges, for example, transistors 1A, 1B, and 1C, to be identical, that is, for example, for the outputs of upper stages 20A, 20B, and 20C to be identical. If one of the control signals is sufficiently high, the temperature or current over-intensity limit of one of the bridges may be reached and the system may cease to function even though the limit over all the transistors has not been reached, the other signals being sufficiently low. Such a difference between the control signals of two transistors is for example caused by variations of certain characteristics (threshold voltage, gain, intrinsic capacitances, on-state resistance, operating temperature, individual protection current, etc.) of the components of the control circuit.

Figure 2:
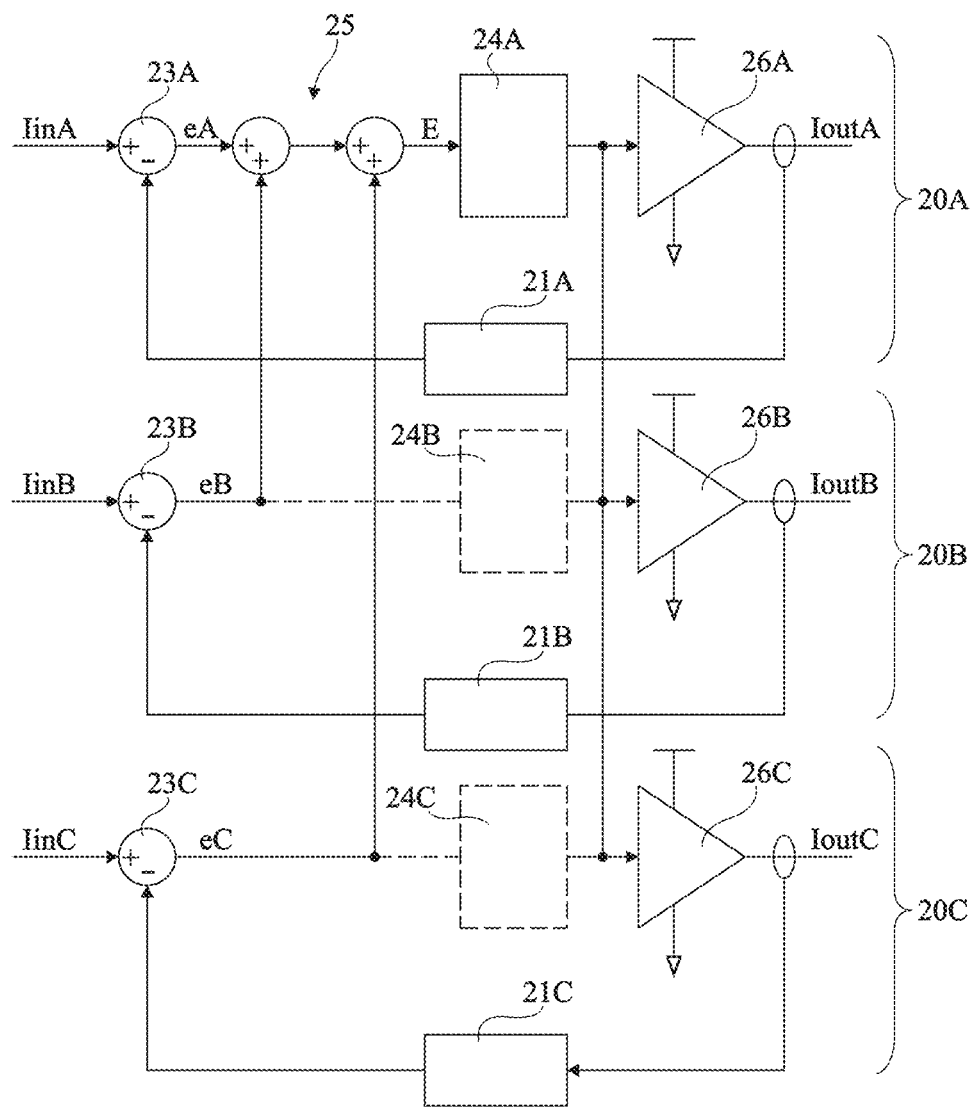
FIG. 2 schematically and partially illustrates an embodiment of a circuit for controlling a stage of the bridges of FIG. 1.

FIG. 2 schematically and partially illustrates an embodiment of a control circuit controlling one of the switches of each assembly 16A, 16B, and 16C. More particularly, FIG. 2 illustrates upper stages 20A, 20B, and 20C of circuits 18A, 18B, and 18C. Lower stages 22A, 22B, and 22C have a structure similar to the structure shown in FIG. 2.

Each upper stage 20A, 20B, and 20C includes a feedback loop outputting a current (e.g. respectively, current IoutA, IoutB, and IoutC) controlling the corresponding switch and receiving as an input a set point signal (IinA, IinB, IinC) of the stage, that is, a signal representative of the current desired at the output.

The output current of each stage 20A, 20B, or 20C is respectively measured by a current measurement device 21A, 21B, or 21C which supplies a value representative of the output current. The current measurement devices 21A, 21B, and 21C may be implemented by devices known in the art to measure current and to output a value indicative of the output current. This value is then subtracted, by an adder 23A, 23B, or 23C, from the set point value to obtain error eA, eB, or eC of the stage.

Errors eA, eB, and eC are then added together, by adders 25, to obtain a total error E. Error E is supplied to a correction circuit of one of the stages. In the example of FIG. 2, this correction circuit is included in stage 20A. Correction circuit 24A is for example a proportional-integral correction circuit or a proportional-integral derivative correction circuit.

Each upper stage 20A, 20B, and 20C includes an operational amplifier which receives as an input the output of correction circuit 24A. The output of correction circuit 24A is thus supplied to three operational amplifiers 26A, 26B, and 26C. The three, substantially identical, operational amplifiers receive the same input signal. The operational amplifiers provide as respective outputs the currents IoutA, IoutB, and IoutC that are substantially identical.

As previously described, when the value of one of the currents IoutA, IoutB, and IoutC, provided to the gates of the transistors, increases sufficiently, it is possible to reach the temperature or current over-intensity limit, above which the system is shut down, for example to avoid it being damaged. In this case, the sum of the values of the currents IoutA, IoutB, and IoutC increases and becomes higher than the sum of the values of the set point signals IinA, IinB, IinC. The correction circuit 24A lowers the values of the currents IoutA, IoutB, and IoutC, so that their sum becomes substantially equal to the sum of the values of the currents IinA, IinB, IinC.

While there may still be a difference between the values of the currents IoutA, IoutB and IoutC, for example caused by variations of certain characteristics of the transistors, the temperature or current over-intensity limit is not reached.

Additionally, the circuits of upper stages 20B and 20C may also include correction circuits 24B and 24C, shown in dotted lines, which may be similar to correction circuit 24A. Stages 20A, 20B, and 20C may also include switches, not shown, between correction circuits 24B and 24C and adders 23B and 23C and between stages 20B, 20C on the one hand and 20A on the other hand. It is thus possible to choose whether it is desired for stages 20A, 20B, and 20C to regulate their outputs independently according to the output of their own correction circuit receiving an error eA, eB, or eC as an input or for their outputs to be regulated together according to the output of a single correction circuit receiving total error E as an input. It is also possible to choose to regulate certain stages independently and to regulate others together.

Figure 3:
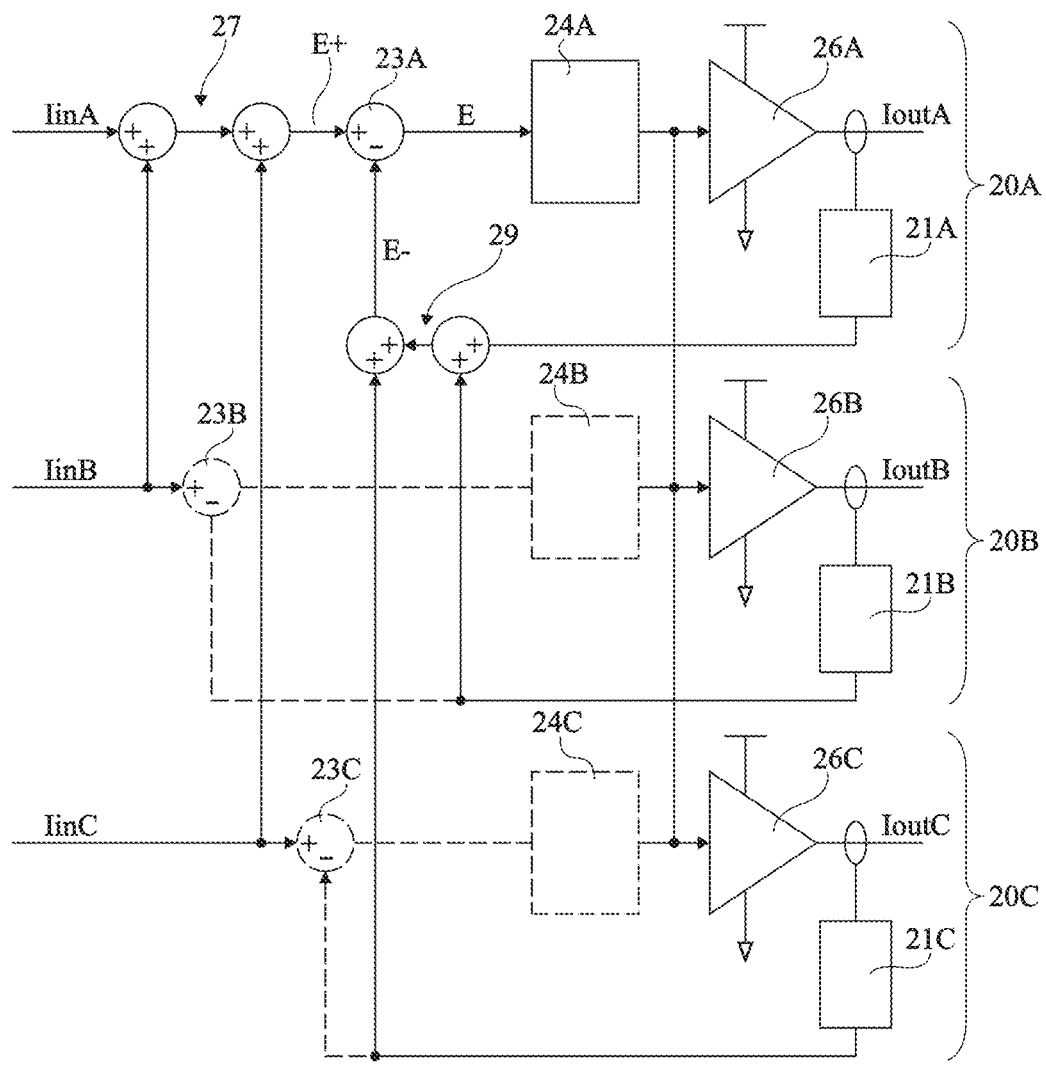
FIG. 3 schematically and partially illustrates another embodiment of a circuit for controlling a stage of the bridges of FIG. 1.

FIG. 3 schematically and partially illustrates another embodiment of a control circuit. Like FIG. 2, FIG. 3 shows upper stages 20A, 20B, and 20C of circuits 18A, 18B, and 18C but could also show stages 22A, 22B, and 22C. Each stage 20A, 20B, or 20C includes, as in FIG. 2, a feedback loop respectively receiving set point IinA, IinB, or IinC, supplying current IoutA, IoutB, or IoutC and including adder 23A, 23B, or 23C, current measurement device 21A, 21B, or 21C outputting a value representative of the output current, operational amplifier 26A, 26B, or 26C regulating the output current, and correction circuit 24A, 24B, or 24C.

The values of the set points of stages 20A, 20B, and 20C are added, by adders 27, to obtain a value E+. The values representative of the output current measured at each stage are added together by adders 29 to obtain a value E−. Adder 23A subtracts value E− from value E+. The result thus obtained is total error E. It is noted that error E of FIG. 3 corresponds to error E of FIG. 2. Error E is supplied to correction circuit 24A of stage 20A, having its output supplied at the input of operational amplifiers 26A, 26B, and 26C. Currents IoutA, IoutB, and IoutC are thus regulated, according to total error E, to be substantially identical.

As previously stated, the control circuit may include switches, not shown, between the different stages of the circuit and between correction circuits 24B and 24C, on the one hand, and adders 23B and 23C on the other hand. Thus, as described in relation with FIG. 2, it is possible for the different stages to act independently from one another, or to all be regulated according to the output of correction circuit 24A.

In the embodiment of FIG. 2 or that of FIG. 3, the set points of each of the upper stages of a control circuit may be substantially identical. In like manner, the set points of each of the lower stages of the control circuit may be substantially identical. As a variation, the set points of the stages of a control circuit may be different from one another. Their sum is however equal to the sum of the desired substantially identical output values.

Figure 4:
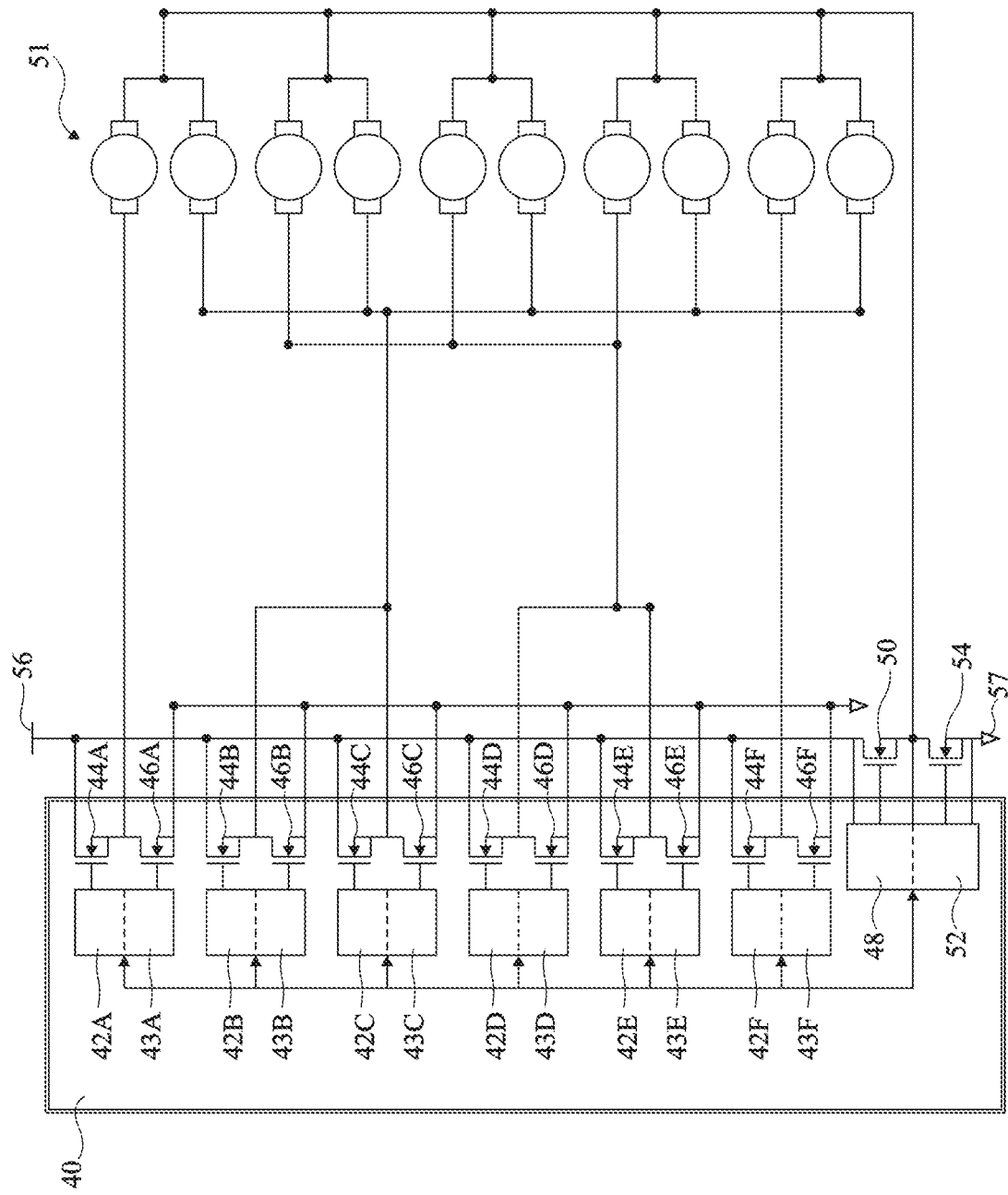
FIG. 4 illustrates an example of application of the embodiments of FIGS. 2 and 3.

FIG. 4 is an example of application of the embodiments of control circuits of FIGS. 2 and 3.

FIG. 4 shows an integrated circuit chip 40 and motors 51. The motors are for example car motors enabling to open and close the windows, the doors, or the trunk, etc.

Chip 40 includes six circuits, each including an upper stage 42 (e.g. respectively, 42A, 42B, 42C, 42D, 42E, 42F) supplying the control signal of a transistor 44 (e.g. respectively, 44A, 44B, 44C, 44D, 44E, 44F) and a lower stage 43 (e.g. respectively, 43A, 43B, 43C, 43D, 43E, 43F) supplying the control signal of a transistor 46 (e.g. respectively, 46A, 46B, 46C, 46D, 46E, 46F). Respective transistors 44 and 46 form the first and second switches of H bridges. Each pair of transistors 44 and 46 is series-connected between a first terminal of application of a power supply voltage (e.g. terminal 56) and a second terminal of application of a second power supply voltage (e.g. terminal 57), as described in relation with FIG. 1.

Chip 40 further includes a circuit including a stage 48 supplying the control signal of a transistor 50 and a stage 52 supplying the control signal of a transistor 54. Transistors 52 and 54 form the third and fourth switches common to all the H bridges. Transistors 50 and 54 are series-connected between a first (56) and a second (57) terminals of application of a power supply voltage, as described in relation with FIG. 1.

Transistors 44 and 46 are transistors located in the integrated circuit. Transistors 50 and 54 are transistors external to the integrated circuit. Indeed, transistors 50 and 54 being common to all H bridges, they should dissipate more heat than each assembly of two transistors 44 and 46. Transistors external to the integrated circuit may more easily dissipate the heat of the assembly of H bridges.

The H bridge including transistors 44A and 46A and the H bridge including transistors 44F and 46F are in parallel with no other bridge and their respective load is a single motor.

The node between transistors 44B and 46B, and the node between transistors 44C and 46C are connected and the two corresponding H bridges are in parallel. The common load of these two bridges in parallel includes five motors.

The H bridges including transistors 44D, 46D, 44E, and 46E are also in parallel and their common load includes three motors.

An advantage of the previously described embodiments is that there is less risk of reaching the temperature or current over-intensity limit of one of the bridges, and thus of stopping the system.

Specific embodiments have been described. Various alterations, modifications, and improvements will occur to those skilled in the art. In particular, although FIGS. 2 and 3 show control circuits including three stages, the number of stages, and thus of transistors in parallel controlled by the control circuit, may be other than three. For example, the number of stages may be in the range from two to six.

Further, although the described control circuits control transistors forming H bridges, the described embodiments are however adaptable to circuits controlling any structure of transistors in parallel internal or external to the integrated circuit. An embodiment where terminal 14 (FIG. 1) is coupled to ground, to a power supply source, or to another circuit is also possible.

Various embodiments with different variations have been described hereabove. It should be noted that those skilled in the art may combine various elements of these various embodiments and variations without showing any inventive step.

Such alterations, modifications, and improvements are intended to be part of this disclosure, and are intended to be within the spirit and the scope of the present invention. Accordingly, the foregoing description is by way of example only and is not intended to be limiting.

What is claimed is:

1. A control circuit comprising:
   a first high-side stage having an output configured to be coupled to a control terminal of a first high-side transistor of a first half-bridge;
   a first low-side stage having an output configured to be coupled to a control terminal of a first low-side transistor of the first half-bridge;
   a second high-side stage having an output configured to be coupled to a control terminal of a second high-side transistor of a second half-bridge; and
   a second low-side stage having an output configured to be coupled to a control terminal of a second low-side transistor of the second half-bridge, wherein the first high-side stage is configured to supply a first high-side control signal to the control terminal of the first high-side transistor based on a first high-side difference between a first high-side output current of the first high-side stage and a first high-side reference current and based on a second high-side difference between a second high-side output current of the second high-side stage and a second high-side reference current, wherein the first high-side stage comprises:
      a first amplifier configured to supply the first high-side control signal;
      a first current measurement circuit coupled to an output of the first amplifier and configured to measure the first high-side output current;
      a first adder having a first input configured to receive the first high-side reference current, a second input coupled to an output of the first current measurement circuit, and an output configured to deliver the first high-side difference;
      a second adder having a first input coupled to the output of the first adder, a second input configured to receive the second high-side difference; and
      a first correction circuit having an input coupled to an output of the second adder and an output coupled to an input of the first amplifier.

2. The control circuit of claim 1, wherein the first low-side stage is configured to supply a first low-side control signal to the control terminal of the first low-side transistor based on a first low-side difference between a first low-side output current of the first low-side stage and a first low-side reference current and based on a second low-side difference between a second low-side output current of the second low-side stage and a second low-side reference current.

3. The control circuit of claim 1, wherein the first correction circuit comprises a proportional-integral correction circuit.

4. The control circuit of claim 1, wherein the second high-side stage comprises a second amplifier configured to supply a second high-side control signal to the control terminal of the second high-side transistor, and wherein the output of the first correction circuit is coupled to an input of the second amplifier.

5. The control circuit of claim 1, wherein the second high-side stage comprises:
  a second amplifier configured to supply a second high-side control signal to the control terminal of the second high-side transistor;
  a second current measurement circuit coupled to an output of the second amplifier and configured to measure the second high-side output current; and
  a third adder having a first input configured to receive the second high-side reference current, a second input coupled to an output of the second current measurement circuit, and an output configured to deliver the second high-side difference.

6. The control circuit of claim 5, wherein the second high-side stage further comprises a second correction circuit having an coupled to the output of the third adder and an output coupled to an input of the second amplifier.

7. The control circuit of claim 1, further comprising:
  a third high-side stage having an output configured to be coupled to a control terminal of a third high-side transistor of a third half-bridge; and
  a third low-side stage having an output configured to be coupled to a control terminal of a third low-side transistor of the third half-bridge, wherein the first high-side stage is configured to supply the first high-side control signal to the control terminal of the first high-side transistor further based on a third high-side difference between a third high-side output current of the third high-side stage and a third high-side reference current.

8. The control circuit of claim 7, wherein the first high-side stage further comprises
  a third adder having a first input coupled to the output of the second adder, a second input configured to receive the third high-side difference, and an output coupled to the first correction circuit.

9. The control circuit of claim 8, wherein:
  the second high-side stage comprises:
    a second amplifier configured to supply a second high-side control signal to the control terminal of the second high-side transistor,
    a second current measurement circuit coupled to an output of the second amplifier and configured to measure the second high-side output current, and
    a fourth adder having a first input configured to receive the second high-side reference current, a second input coupled to an output of the second current measurement circuit, and an output configured to deliver the second high-side difference; and
  the third high-side stage comprises:
    a third amplifier configured to supply a third high-side control signal to the control terminal of the third high-side transistor,
    a third current measurement circuit coupled to an output of the third amplifier and configured to measure the third high-side output current, and
    a fifth adder having a first input configured to receive the third high-side reference current, a second input coupled to an output of the third current measurement circuit, and an output configured to deliver the third high-side difference.

10. The control circuit of claim 9, wherein the second high-side stage further comprises a second correction circuit having an input coupled to the output of the fourth adder and an output coupled to an input of the second amplifier, and wherein the third high-side stage further comprises a third correction circuit having an input coupled to the output of the fifth adder and an output coupled to an input of the third amplifier.

11. A control circuit comprising:
  a first high-side stage comprising:
    a first amplifier configured to supply a first high-side control signal to a control terminal of a first high-side transistor of a first half-bridge,
    a first current measurement circuit coupled to an output of the first amplifier and configured to measure a first high-side output current of the first high-side stage,
    a first adder having a first input configured to receive a first high-side reference current, a second input, and an output coupled to an input of the first amplifier;
  a first low-side stage having an output configured to be coupled to a control terminal of a first low-side transistor of the first half-bridge;
  a second high-side stage comprising:
    a second amplifier configured to supply a second high-side control signal to a control terminal of a second high-side transistor of a second half-bridge;
    a second current measurement circuit coupled to an output of the second amplifier and configured to measure a second high-side output current of the second high-side stage; and
  a second low-side stage having an output configured to be coupled to a control terminal of a second low-side transistor of the second half-bridge, wherein the first high-side control signal is based on the first high-side output current, the first high-side reference current, the second high-side output current, and a second high-side reference current.

12. The control circuit of claim 11, wherein the second input of the first adder is configured to receive the second high-side reference current.

13. The control circuit of claim 12, wherein the first high-side stage further comprises:
  a second adder having a first input coupled to an output of the first current measurement circuit, and a second input coupled to an output of the second current measurement circuit; and
  a third adder having a first input coupled to the output of the first adder, a second input coupled to an output of the second adder, and an output coupled to the input of the first amplifier.

14. The control circuit of claim 13, wherein the first high-side stage further comprises a first correction circuit having an input coupled to the output of the third adder and an output coupled to the input of the first amplifier.

15. The control circuit of claim 14, further comprising:
a third high-side stage comprising:
- a third amplifier configured to supply a third high-side control signal to a control terminal of a third high-side transistor of a third half-bridge,
- a third current measurement circuit coupled to an output of the third amplifier and configured to measure a third high-side output current of the third high-side stage,
- a fourth adder having a first input configured to receive a third high-side reference current, a second input, and an output coupled to an input of the third amplifier; and
a third low-side stage having an output configured to be coupled to a control terminal of a third low-side transistor of the third half-bridge, wherein the first high-side stage further comprises a fifth adder having a first input coupled to the output of the first adder, a second input configured to receive the third high-side reference current and an output coupled to the input of the third adder.

16. The control circuit of claim 15, wherein the first high-side stage further comprises a sixth adder having a first input coupled to the output of the second adder, a second input coupled to the output of the third current measurement circuit, and an output coupled to the second input of the third adder.

17. The control circuit of claim 16, wherein:
the second high-side stage further comprises a second correction circuit having an output coupled to the input of the second amplifier, and a seventh adder having a first input configured to receive the second high-side reference current, a second input coupled to the output of the second current measurement circuit, and an output coupled to an input of the second correction circuit; and
the third high-side stage further comprises a third correction circuit having an output coupled to the input of the third amplifier, and an eighth adder having a first input configured to receive the third high-side reference current, a second input coupled to an output of the third current measurement circuit, and an output coupled to an input of the third correction circuit.

18. The control circuit of claim 16, wherein the output of the first correction circuit is further coupled to the input of the second amplifier and to the input of the third amplifier.

19. An integrated circuit comprising:
a first half-bridge having a first high-side transistor and a first low-side transistor;
a second half-bridge having a second high-side transistor and a second low-side transistor;
a first high-side stage comprising:
- a first amplifier configured to supply a first high-side control signal to a control terminal of the first high-side transistor,
- a first current measurement circuit coupled to an output of the first amplifier and configured to measure a first high-side output current of the first high-side stage,
- a first adder having a first input configured to receive a first high-side reference current, a second input, and an output coupled to an input of the first amplifier;
a first low-side stage having an output coupled to a control terminal of the first low-side transistor;
a second high-side stage comprising:
- a second amplifier configured to supply a second high-side control signal to a control terminal of the second high-side transistor;
a second current measurement circuit coupled to an output of the second amplifier and configured to measure a second high-side output current of the second high-side stage; and
a second low-side stage having an output configured to be coupled to a control terminal of the second low-side transistor, wherein the first high-side control signal is based on the first high-side output current, the first high-side reference current, the second high-side output current, and a second high-side reference current.

20. The integrated circuit of claim 19, wherein the first high-side stage further comprises a proportional-integral correction circuit coupled between the first adder and the first amplifier.

* * * * *